United States Patent [19]
Mon

[11] Patent Number: 5,190,099
[45] Date of Patent: Mar. 2, 1993

[54] PULSATILE IMPINGING COOLING SYSTEM FOR ELECTRONIC IC MODULES AND SYSTEMS USING FLUIDIC OSCILLATORS

[75] Inventor: George Mon, Potomac, Md.

[73] Assignee: The United States of America as represented by the Secretary of the Army, Washington, D.C.

[21] Appl. No.: 695,145

[22] Filed: May 1, 1991

[51] Int. Cl.$^5$ .......................................... H01L 23/467
[52] U.S. Cl. ............................ 165/104.33; 165/109.1; 165/908; 239/589.1; 361/384
[58] Field of Search ...................... 239/589.1; 361/384; 165/109.1, 104.33, 908

[56] References Cited

U.S. PATENT DOCUMENTS

| Re. 27,938 | 3/1974 | Bauer | 239/589.1 |
| 3,741,481 | 6/1973 | Bauer | 239/589.1 |
| 3,843,910 | 10/1974 | Ringuet | 361/384 |

*Primary Examiner*—Albert W. Davis, Jr.
*Attorney, Agent, or Firm*—Saul Elbaum; Freda L. Krosnick

[57] ABSTRACT

A fluidic pulsatile impinging cooling system for electronic integrated circuit modules and other electronic systems. The fluidic cooling system employs a fluidic oscillator to create the pulsatile cooling flow of air or fluid. The present invention reduces the number of moving parts present in an electronic cooling system and is more efficient in performing its purpose.

5 Claims, 3 Drawing Sheets

PULSATILE IMPINGING COOLING SYSTEM FOR ELECTRONIC IC MODULES AND SYSTEMS USING FLUIDIC OSCILLATORS

RIGHTS OF THE GOVERNMENT

The invention described herein may be manufactured, used and licensed by or for the U.S. Government without payment to us of any royalty thereon.

BACKGROUND OF THE INVENTION

Many methods have been employed to cool electronic equipment during its operation. One of the most commonly used methods is by employing an air blower to force ambient air into an electronic equipment cabinet. The ambient air removes heat from the electronic components as it passes through the cabinet as shown in FIG. 1. Since within the cabinet of an electronic device there exists many obstacles which would effect the ambient air flow, uneven heat removal will occur and hot spots will remain throughout the cabinet. Consequently, the components which are not adequately cooled or reached by the ambient air flow will fail prematurely due to overheating.

One solution to this problem would be to install a larger air blower into the cabinet so that it can force greater quantities of air through the components contained therein. Installation of a larger blower, however, carries with it other problems. It adds additional weight to the electronic system and also consumes larger amounts of energy. These are undesirable characteristics for any electronic system.

Recently, the combination of impinging air cooling cooling and heat sink, as set forth in FIG. 2, has been used to remove heat locally from heat generating integrated circuit (IC) modules. In addition, at times, closed circuit liquid cooling devices are required to remove heat from IC modules such as CPU modules in IBM ® mainframe computers. The present invention provides a more efficient and economical means for cooling IC modules.

It has been proven through experimentation that, for a given flow rate of air, a pulsating flow of air is more efficient in removing heat from a heat transfer surface than a steady air flow. Even though it has been proven that a pulsating flow of air is more effective for cooling, almost all of the existing cooling systems employ devices which use a steady flow of air. The reason for this is that a steady flow of air, although less efficient than a pulsating flow of air, is much more easily attainable than a pulsating flow. Moreover, generally speaking, a pulsating system is more complex and less reliable than that of a steady flow system because conventional pulsating systems require the use of additional moving components therein to generate pulsatile air flow. The presence or requirement of additional moving parts increases the likelihood of malfunction.

The present invention is able to create the desired pulsating air flow without the use of any moving parts or any electronics.

BRIEF SUMMARY OF THE INVENTION

The present invention resides in an apparatus which improves the heat transfer process related to the cooling of IC devices and electronic systems. The primary purpose of this invention is to improve the heat transfer process as related to the cooling of said systems.

As previously set forth, the majority of cooling systems use a steady flow of air to cool electrical components during the system's operation. For example, a conventional blower is used to cool the interior of a computer cabinet. However, because there are many obstacles present inside the cabinet, uneven heat removal occurs. It is already well established that pulsating forced air would be more efficient in removing the heat from an electronic system's heat sink. However, conventional pulsating systems are complex devices and require the use of numerous moving parts and electrical components therein. Therefore, it is the purpose of the present invention to obtain the efficient cooling effects of pulsating forced air by using a cooling system which adds no moving parts or electronics to the electrical system to be cooled.

The purpose of the present invention is fulfilled through the use of fluidic techniques. By employing fluidics, one can design a pulsating cooling system without difficulty. Since, the fluidic system has no moving parts or electronic devices within, it will not degrade the reliability of the IC device or electronic system.

The cooling system herein is both reliable and efficient in its operation. It contains no moving parts; and is essentially maintenance free. Fluidic devices are not susceptible to mechanical or electrical failure. Therefore, any failure in a cooling system of the present invention would not stem from the fluidic oscillator employed herein.

Accordingly, it is an object of the present invention to provide a cooling system for electronic systems and IC modules which employ fluidic techniques.

It is a further object of the present invention to employ fluidic oscillators into a cooling system in order to generate a pulsating flow for impinging cooling of IC modules and electronic systems.

Still a further object of the present invention is to produce an IC module and electronic systems cooling system containing few moving parts and electronic devices.

A further object of the present invention is to produce a reliable and efficient cooling system which makes use of fluidic technology.

A further object of the present invention is to provide a cooling system which generates pulsating air flow using a fluidic oscillator.

Other objectives and features of the present invention will be apparent from the following detailed description of the invention, drawings and the claims.

DETAILED DESCRIPTION OF THE INVENTION

The pulsatile impinging cooling system of the present invention is an efficient and reliable system which will greatly enhance the life of electronic equipment in every industry. In order to maintain the operability of electronic equipment, a blower-type cooling system has been incorporated therein. The components in an electronic device cannot be allowed to overheat. Overheating of any component increases the likelihood of mechanical and/or electrical failure of the electronic device.

In the present invention, the pump of a conventional blower-type cooling system is replaced with a conventional fluidic oscillator. The fluidic oscillator will provide a cooling system with the ability to supply an electronic device with a pulsatile cooling air flow.

The primary novelty of the present invention resides in the incorporation of a fluidic oscillator into a cooling system. Fluidics is a technology which employs the interaction of fluid or air stream and pressure fields to perform sensing, signal amplification and control operations without the use of moving parts. The present invention employs a fluidic oscillator. FIG. 3 is a schematic drawing of the type of conventional fluidic oscillators which may be employed in the present invention. Generally speaking, a fluidic oscillator is constructed from a fluidic laminar proportional amplifier having negative feedback.

A fluidic oscillator comprises a supply port, vent ports, output ports, feedback lines and input ports. More specifically, it consists of a fluidic proportional amplifier, two positive feedback paths and two output ports. The input ports recirculate the fluidic air flow recycled through the feedback lines. This fluidic oscillator causes the air exiting through its output ports and into the equipment cabinet to be pulsatile in nature. If the fluidic amplifier has a perfect symmetry, the pulsatile jet flow will be divided equally between the output ports and there will be no deflection of the supply jet. As a result of this configuration, equal feedback flow will enter into each of the two input ports. Consequently, a steady flow will be exiting from each of the output ports.

A fluidic oscillator having the desired performance characteristics can be easily designed. Since it is virtually impossible to fabricate a fluidic proportional amplifier with perfect symmetry, unbalanced flow will always be created within the amplifier. Suppose, for example, that the supply jet of air is initially biased to flow more into output port B, and causes more feedback flow to flow into input port B via feedback path B. Under this scenario, this will create a pressure difference across the supply jet in the interaction region. This pressure differential will cause the jet stream to deflect toward output port A. Consequently, air flow will flow into input port A via feedback path A and cause the supply jet to deflect toward the other output port. This cycle is continuously repeated. As long as there is a supply pressure applied to the amplifier's supply port, the output flow will oscillate between the two output ports. For a given oscillator configuration, the frequency of oscillation is primarily dependent on the supply jet velocity and the length of the feedback path. This activity in the fluidic device is what causes the pulsating flow of air.

One skilled in the art would be familiar with the exact operation of an oscillator of the type described above. Accordingly, the skilled artisan would be able to design a fluidic oscillator having the performance characteristics desired. Fluidic oscillators used within the scope of the present invention may be composed of any materials compatible with the materials of the electronic system or the integrated circuit in which it is to be employed.

Any conventional fluidic oscillator may be incorporated into the present invention. As previously set forth the conventional fluidic oscillator replaces the pump in the conventional forced air cooling system. In the fluidic pulsating forced air cooling system within the scope of the present invention, a conventional cool air source supplies cool air to the supply nozzle of the fluidic oscillator. The cool air which exits through the fluidic oscillator's output ports are directed through conventional plenums and to, for example, IC modules. The impinging cool air flow will carry the heat from the heat sinks of the IC modules and cool the IC modules. Due to the pulsating nature of the impinging cool air flow, the heat transfer is, then, enhanced because the pulsating action of the flow breaks up the thermal boundary near the heat transfer surface. As a result, while the cooling system of the present invention is employed, no hot spots will be formed in the IC modules. The cool air which has been converted into hot air is then caused to exit from the cooled IC module. Note the schematic presentation of a fluidic pulsating forced air cooling system set forth in FIG. 4.

An additional embodiment of the present invention involves the structuring of the fluidic, pulsating cooling system in a closed-circuit configuration. This embodiment operates in the same fashion as the fluidic pulsating forced air cooling system described above; however, the hot air exiting from the cooled IC module travels through a return line which is connected to a conventional heat exchanger for recirculation of said hot air. The recirculated air is then stored in a conventional cool air reservoir and pumped again through the fluidic oscillator as required. This closed circuit fluidic pulsating cooling system is depicted in FIG. 5.

The fluidic pulsating cooling system of the present invention employs conventional plunums, conventional IC modules, conventional heat exchangers, conventional air pumps, and even conventional fluidic oscillators. The novelty of the present invention resides in the combination of said conventional components to produce a fluidic pulsating cooling system. More specifically, the novelty herein resides in the use of a fluidic oscillator in a pulsating cooling system.

Other features of the present invention will be apparent from the following drawings and their description.

DETAILED DESCRIPTION OF THE DRAWINGS

The drawings will be further discussed in order to provide a better understanding and description of the present invention.

Figure 1:
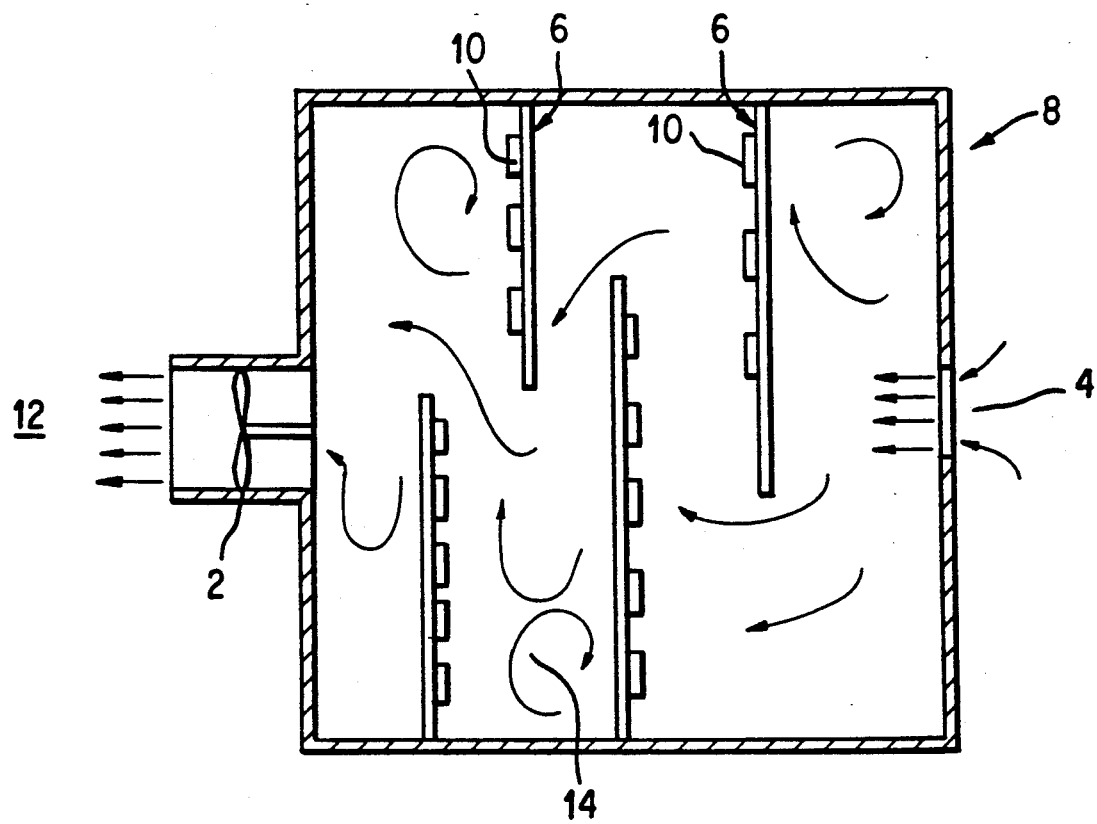
FIG. 1 is a schematic illustration of a conventional cooling system for electronic equipment which employs the use of an air blower.

FIG. 1 illustrates the operation of a conventional cooling system for IC module 8. The conventional, prior art cooling system employs an air blower 2 used to assist in the circulation of forced air 14. The air blower 2 is used to force ambient air into one side of the equipment cabinet 4 and remove the ambient air which has turned into heat from the other side 12. Note that many obstacles, such as circuit board 6, are present within the electronic IC module 8; therefore, uneven heat removal is likely to occur and hot spots 10 will be created throughout the IC module 8. Hot spots 10 are the culprit of component failure due to premature overheating. In order to overcome this problem, the installation of larger blowers has been proposed. Installation of larger blowers, however, not only adds weight to the IC module system, but it also causes wasted energy. The present invention substantially reduces and/or eliminates the number of hot spots 10 produced.

Figure 2:
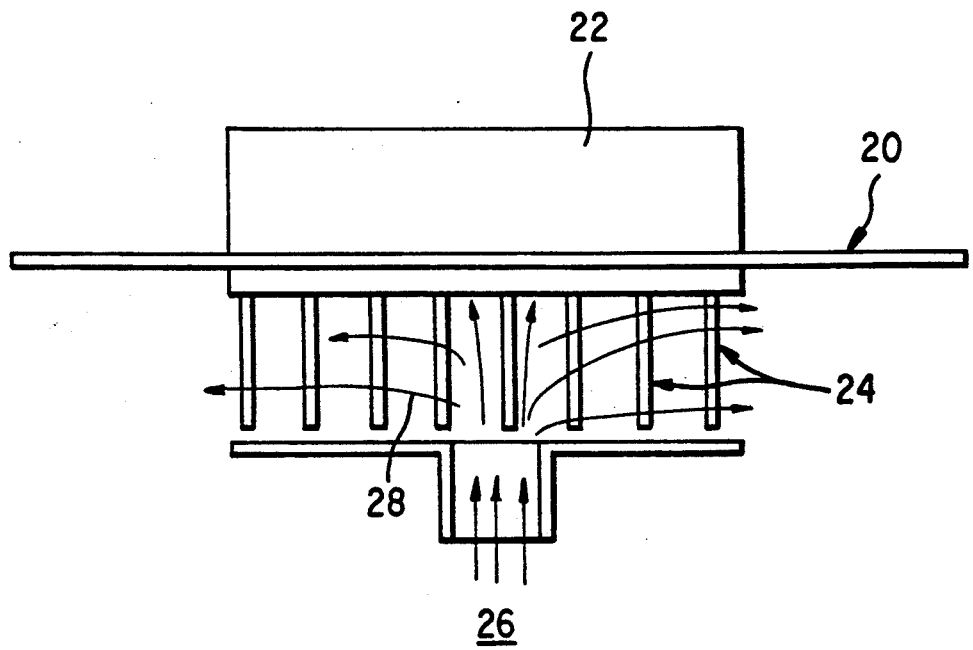
FIG. 2 is a schematic representation of a conventional impinging forced air cooling system of the prior art.

FIG. 2 illustrates a schematic of an impinging forced air or liquid cooling system of the prior art. This system has heat sinks for the electronic IC module 22. Said cooling system makes use of a forced air inlet 26 where a cool air or cool liquid is supplied; numerous pins or fins 24 to assist in directing the cool fluid flow; and printed circuit board 20. The forced air 28, for example, is circulated between the pins or fins 24 in order to keep the printed circuit board 20 of the IC module 22 from overheating.

Now that the prior art types of cooling systems have been briefly set forth above, the invention herein will be discussed with reference to FIGS. 3–5.

Figure 3:
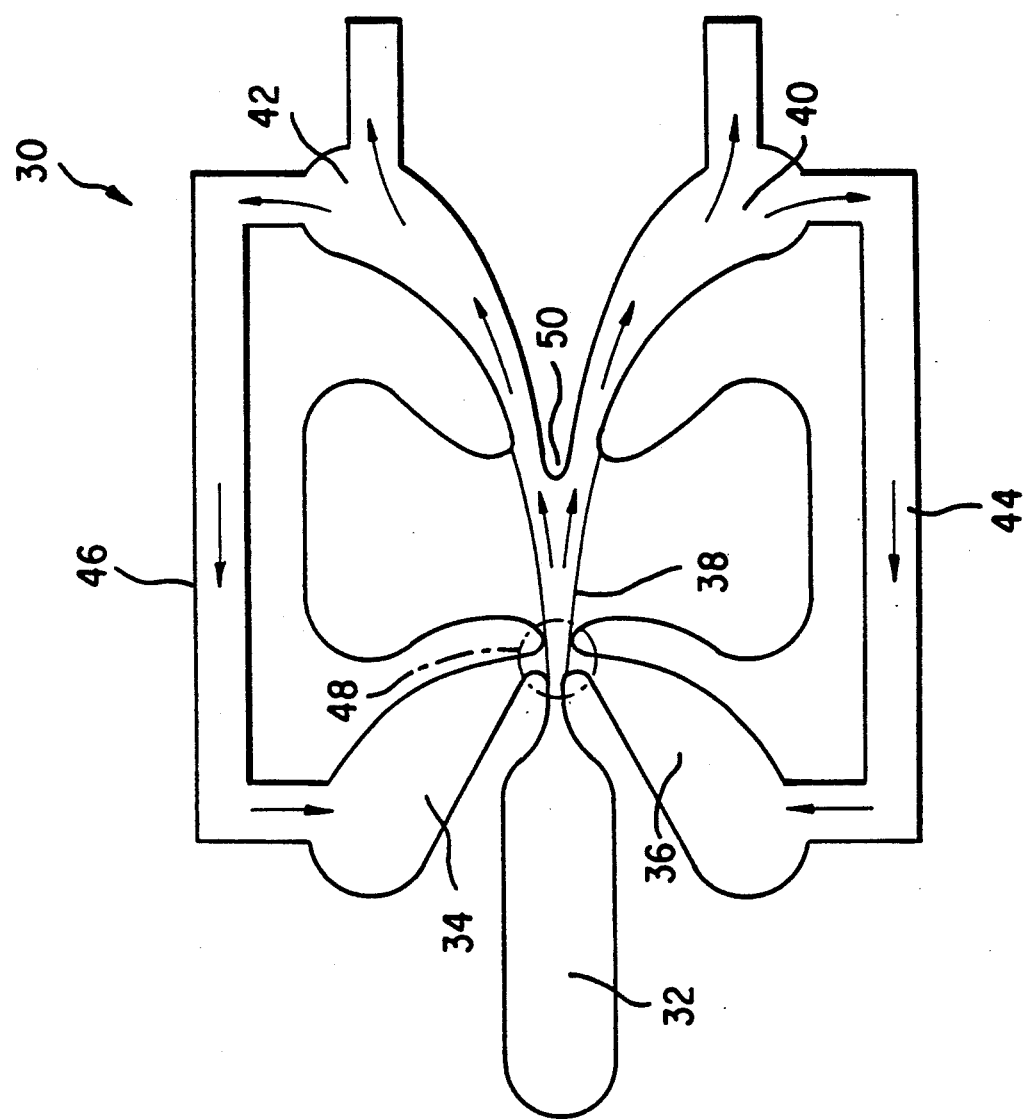
FIG. 3 is a schematic representation of a feedback fluidic oscillator of the type which may be employed in the invention herein.

FIG. 3 illustrates a schematic diagram of the positive feedback fluidic oscillator 30 which may be used within the scope of the present invention. Said oscillator 30 has numerous component features, such as supply nozzle 32, input ports A and B, 34 and 36, respectively, output ports A and B, 40 and 42, respectively, and feedback paths A and B, 44 and 46, respectively. Note that the structure of oscillator 30 is such that it comprises interaction region 48 and splitter 50. The Figure further illustrates, through the use of arrows, the path of the supply jet 38.

The following is a brief description of the fluidic oscillator's 30 principle of operation. When pressure is applied (liquid or air) to the supply nozzle inlet 32, a jet flows into the output ports A and B, 40 and 42, as shown. If the oscillator has perfect symmetry, the jet flow will be divided equally into each output ports 40 and 42. As a result, equal feedback flow will travel through feedback paths A and B, 44 and 46, which will result in equal flow back into input ports A and B, 34 and 36. In this situation, there will be no deflection of the supply jet. However, as described earlier in this application, since it is virtually impossible to fabricate a fluidic proportional amplifier with perfect symmetry, unbalanced flow will always be created within the amplifier.

Suppose, however, that the supply jet 38 is initially biased to flow more into output port B 42, this allows more feedback flow to travel into input port B 36 via feedback path B 46. This flow creates a pressure difference across the supply jet 38 in the interaction region 48. This pressure difference causes the jet 38 to deflect toward output port A 40. Consequently, more jet flow 38 will flow into input port A 34 via feedback path A 44 and then cause the supply jet 38 to deflect toward the other output port. This cycle is repeated. It is this process which produces a pulsatile fluidic stream.

Figure 4:
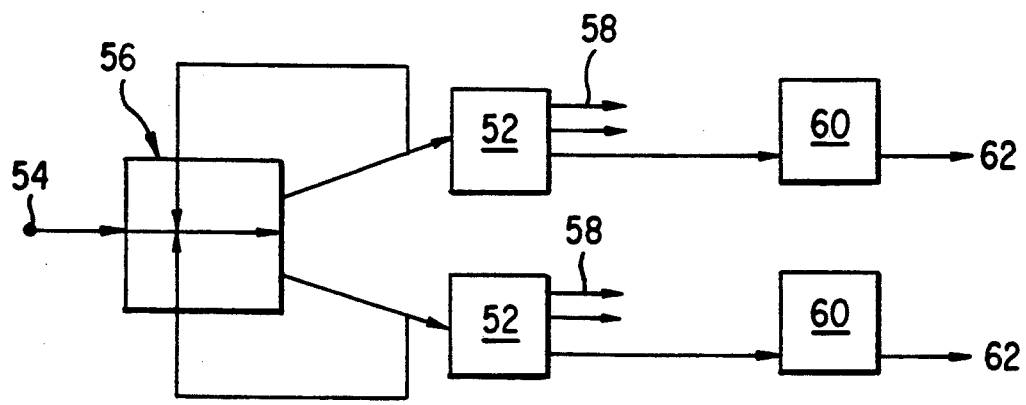
FIG. 4 is a schematic illustration of the fluidic pulsatile impinging forced air cooling system of the present invention.

FIG. 4 illustrates a schematic diagram of a fluidic pulsatile impinging cooling system within the scope of the present invention. The cooling system comprises a fluid supply 54, a fluidic oscillator 56, two output plenums 52 and conventional fluid lines 58 to facilitate the flow of cool air or fluid to IC modules 60. The fluid lines 58 carry the flow of cooling air from the plenums 52 to the IC modules 60. The cooling air flow will carry the heat from the heat sinks within said IC modules 60 and cool the IC modules 60. The pulsating flow of cool air created by the fluidic oscillator 56 causes the thermal boundary near the heat transfer surface to break up; and, as a result, no hot spots are created in IC modules 60.

Figure 5:
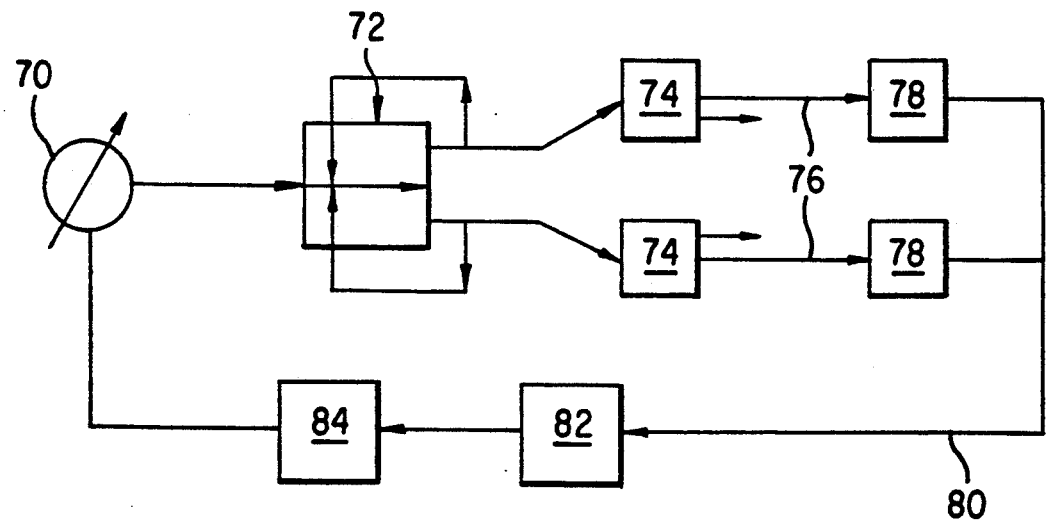
FIG. 5 is a schematic representation of a closedcircuit, fluidic pulsating cooling system within the scope of the present invention.

FIG. 5 sets forth a schematic diagram of a closed-circuit fluidic pulsatile impinging cooling system within the scope of the present invention. This is an additional embodiment of the invention herein. Its operational principle is similar to that of the cooling system set forth in FIG. 4, except that the heated liquid coming out from the IC modules 78 is returned through return line 80 to a conventional heat exchanger 82 which converts the heated liquid or air into a cool liquid or air. Said cool liquid or air is then sent to the reservoir 84 where it is stored to be reused. Conventional pump 70 facilitates the flow from said reservoir 84.

Note that in the embodiment set forth in FIG. 5, the fluidic cooling device comprises the basics as set forth in FIG. 4—a fluidic oscillator 72, fluidic plenums 74, IC modules 78, and cool air lines 76.

All of the component parts of the cooling system of the present invention are conventional. The invention does not reside in any of the individual parts therein; rather it resides in the combination of said components. More specifically, the novelty of the present invention resides in the use of fluidics in creating a pulsatile impinging cooling system for electronic IC modules and systems.

While particular embodiments of the present invention have been shown and described, it will be obvious to those skilled in the art that changes and modifications may be made without departing from this invention. Therefore, it is intended that the claims herein are to include all such obvious changes and modifications as fall within the true spirit and scope of this invention.

I claim:

1. A pulsatile impinging cooling system comprising
   a fluidic feedback oscillator to produce a pulsating flow of fluid to enhance the heat transfer process; and
   at least one integrated circuit module.

2. A pulsatile impinging cooling system as set forth in claim 1, wherein said fluidic feedback oscillator comprises
   a supply nozzle;
   at least one input port;
   at least one output port;
   at least one feedback path;
   a splitter; and
   an interaction region.

3. A closed circuit fluidic liquid cooling system for electronic systems comprising
   a supply of cool fluid;
   a fluidic feedback oscillator to produce a pulsating flow of said cool fluid to enhance the heat transfer process;
   at least one plenum;
   lines connecting said plenum to an electronic system;
   at least one electronic system to be cooled;
   a return line to facilitate the transfer of heated fluid exiting from said eletronic system to a heat exchanger;
   a heat exchanger to recycle the heated fluid as cool fluid;
   a reservoir to store said recycled fluid; and
   a pump to force said recycle fluid into said fluidic feedback oscillator.

4. A closed circuit fluidic liquid cooling system as set forth in claim 3, wherein said electronic system to be cooled is an integrated circuit module.

5. A pulsatile impinging cooling system comprising
   a fluidic feedback oscillator to produce a pulsating flow of fluid to enhance the heat transfer process; and
   at least one electronic system to be cooled.

* * * * *